(12) United States Patent
Wadland et al.

(10) Patent No.: US 7,562,330 B1
(45) Date of Patent: Jul. 14, 2009

(54) BUDGETING GLOBAL CONSTRAINTS ON LOCAL CONSTRAINTS IN AN AUTOROUTER

(75) Inventors: Ken Wadland, Grafton, MA (US); Sean Bergan, Andover, MA (US); Randall Lawson, Westford, MA (US); Keith Woodword, San Diego, CA (US); Richard Woodward, San Diego, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 245 days.

(21) Appl. No.: 11/556,837

(22) Filed: Nov. 6, 2006

(51) Int. Cl.
*G06F 17/50* (2006.01)

(52) U.S. Cl. .................... 716/14; 716/4; 716/5; 716/6; 716/12; 716/13; 716/15

(58) Field of Classification Search ............... 716/8–15, 716/4–6
See application file for complete search history.

(56) References Cited

U.S. PATENT DOCUMENTS

| 4,615,011 A | * | 9/1986 | Linsker | 716/13 |
| 6,253,364 B1 | * | 6/2001 | Tanaka et al. | 716/13 |
| 6,622,291 B1 | * | 9/2003 | Ginetti | 716/9 |
| 7,437,695 B1 | * | 10/2008 | Ranjan et al. | 716/6 |

* cited by examiner

*Primary Examiner*—Thuan Do
*Assistant Examiner*—Nghia M Doan
(74) *Attorney, Agent, or Firm*—Rosenberg, Klein & Lee

(57) ABSTRACT

Local constraints on placement of routing objects for direct connections between terminals in a circuit layout are determined from global constraints on the placement of the routing objects in a process referred to as global constraint budgeting. An autorouter finds paths in the layout to satisfy the local constraints and ignores the global constraints. The local constraints are updated before each routing pass to ensure that routes are completed on individual direct connections while also satisfying the global constraint.

18 Claims, 16 Drawing Sheets

BUDGETING GLOBAL CONSTRAINTS ON LOCAL CONSTRAINTS IN AN AUTOROUTER

BACKGROUND OF THE INVENTION

1. Field of the Invention

The invention disclosed herein is related to the determining routes for interconnections or paths between terminals of interoperable components. More specifically, the invention is related to path-finding in accordance with constraints on directly-connected pairs of terminals to satisfy constraints globally applied to a circuit layout. Such methodology is applicable in such fields as automatic circuit path routing, or autorouting, of printed and integrated circuits.

2. Description of the Prior Art

Automatic electric circuit routers, or autorouters, are path-finding mechanisms for forming conductor paths in a circuit layout that meet predetermined design goals. The present invention is directed to providing features heretofore unavailable in traditional autorouters and these features will be detailed below. However, in order to properly describe the invention in terms of its numerous advantages, it is believed beneficial to first define certain terminology that is used both in the context of traditional autorouters as well as in the context of the present invention.

As used herein, a "design" is an Electronic Design Automation (EDA) database of information describing a Printed Circuit Board (PCB), and Integrated Circuit (IC), an IC package, or a System-in-Package (SiP). A "system", then, is a set of designs. For example, the collection of electrical components depicted in FIG. 1A includes an IC 110 in an IC package 120, which is a component of a circuit board 130. Similarly, IC 170 is contained in an IC package 160, which is a component of circuit board 150. The circuit boards 130 and 150 are inserted into the backplane 140, through which various circuits on both circuit boards are coupled. The set of designs for the electronic system of FIG. 1A is a system, as used herein, as are any of the subsets of designs. Indeed, many of the various IC's and packages on circuit board 130 may be systems and it is to be made clear that one system may be a hierarchy of systems, each having an associated set of designs.

A "terminal" is a location on one or more layers of a design to which electrical signals might be connected. For a PCB, terminals are typically referred to as pins, pads, or balls. For an IC Package or SiP design, terminals are typically referred to as IC bumps or package balls. A terminal may also be a junction point, sometimes referred to as a virtual pin or a T-junction. Various terminals are illustrated in FIG. 1B, such as terminal 180 and terminal 186. Terminal 184 is an example of a T-junction terminal.

Often, multiple terminals are grouped together into what is referred to herein as a "component". Such a component is depicted at both 210 and 240 of FIGS. 2A and 2B.

A "connection" is a pair of terminals that are to be electrically connected. As is shown in FIG. 2A, component 210 includes terminals 212 and 214 and component 240 includes terminals 242 and 244. Terminals 212 and 242 form a connection 220 and terminals 214 and 244 form a connection 230. A connection may alternatively be referred to as a "rat", a "fly line" or a "rubber band". A connection includes two terminals, a "source terminal", such as shown at 212 and 214, and a "target terminal", such as shown at 242 and 244.

A "route" is a particular path that implements a particular connection starting at a source terminal and ending at a target terminal. Exemplary routes for connections 220 and 230 of FIG. 2A are shown as routes 250 and 260, respectively, in FIG. 2B.

A "geometric route" is a path defined by a sequence of explicit geometric shapes, such as path segments or arcs, on one or more layers of a design. When a path transitions from one layer to another, the geometric shapes which form the transition between the layers are collectively referred to as a "via". The geometric shapes forming the paths of a geometric route, as well as other geometric shapes that are embodied in a completed system, such as terminal pads and vias, will be referred to herein as "routing objects".

A "topological route" is a representation of a path specified by what objects it is between. These objects may be terminals or other routes, or they may be "obstacles", such as keep out areas, drill holes or any other geometric or topological items in the design. A single topological route represents a set of diffeomorphic geometric routes, i.e., a set of geometric routes that can be morphed into one another through a continuous sequence of perturbations without changing the route's path relative to any other terminal, route or obstacle. A topological route may or may not have associated geometric locations, which determine one or more possible geometric routes represented by the topological route.

A "net" is a collection of terminals that are to be electrically connected. In some cases, the connections are specified in advance, such as when a particular terminal must connect directly to another specified terminal. In other cases, the particular arrangement of the various connections of a net is determined by path-finding routines of the autorouter, possibly subject to constraints imposed by certain design rules. In the absence of any connectivity rules, for example, an autorouter may be allowed to change the collection of connections as needed, provided the new collection still connects all of the terminals of the net.

An "extended net" is a collection of nets that are electrically related. For example, if two nets are electrically connected through a passive device, such as a series resistor, then the two nets form an extended net, sometimes referred to as an "Xnet". If the two nets are on different designs and are electrically connected through a backplane, then they form an extended net that is sometimes referred to as an "SXnet". Other examples of extended nets exist, such as nets inside an IC connecting through an IC package to a PCB, or nets on a daughterboard connected to nets on a motherboard. An exemplary extended net is illustrated in FIG. 1A by terminals indicated by the arrows at the various circuits. In the example, a terminal on IC 110 is coupled through a terminal on package 120 to the circuit board 130. The terminal on circuit board 130 is coupled through a connector on backplane 140 to circuit board 150, to a terminal on package 160 and then to a terminal on IC 170, where the extended net is terminated. Such an extended net may be as depicted in FIG. 1B, where source terminal 180 is connected through bus 142 to target terminal 188.

A "pin pair" is any pair of terminals belonging to the same extended net. There may be a single connection between the two terminals, in which case, the pin pair will be referred to as a "direct connection" and a route implementing the direct connection will be referred to herein as a "direct route". Alternatively, there may be a series of connections between terminals of the extended net that, as a group, form an "indirect connection". Referring to FIG. 1B, the connection 194 between terminals 186 and 184 is a direct connection, as is connection 192, whereas the connection between terminals 180 and 186 is an example of an indirect connection. A "connection group" is any interconnected set of one or more direct connections, for example, a net, an extended net or a pin pair.

A "constraint", characterized by a "type of constraint", is a design rule that may be applied to one or more connection groups. For example, a "maximum length constraint" is a type of constraint that can be applied to a pin pair, a net or an extended net. When applied to a pin pair, the maximum length constraint limits the sum of the lengths of each of the segments implementing the routes of each of its connections.

A "constraint instance" is a particular type of constraint applied to a particular item of a design. For example, a design rule limiting the maximum length for a net A-B-C to 3.0 inches is a constraint instance of the maximum length type of constraint.

A "numeric constraint" is a type of constraint that is defined in terms of a specific range of numeric values. The values may represent distance, such as 5.0 mils (thousandth of an inch). Examples of such distance-based constraints include minimum length, maximum length, track width, and clearance or separation between two routing objects. The numeric values may also represent time, for example, to specify minimum delay and maximum delay. The numeric values may also represent other physical entities, such as maximum cross talk as specified by a maximum voltage on a victim net. Some numeric values will simply be an integral value, such as the maximum number of vias and maximum number of layers allowed.

A "selection constraint" is a type of constraint that is defined in terms of a range of alternatives. For example, "layer set group ⅔ or ⅚" is a selection constraint that specifies alternative groups of layers on which the placement of routing objects is concurrently allowed. In this example, it specifies that routes must be on layers 2 and 3 or on layers 5 and 6. In accordance with this example, the constraint would allow routing a connection entirely on layer 2 or it would allow routing entirely on layers 5 and 6. But, it would prohibit routing the connection on both layer 2 and layer 6.

A "match constraint" is a type of constraint that requires that the same numeric range be applied to two or more connection groups, but without specifying explicit values for that range. For example, a match delay applied to a set of connections may require that the delay on paths of each of the connections be within some range. In this case, the range is specified as a tolerance or difference between max and min, but the specific min and max values are not specified.

A "relative constraint" is a type of constraint where the numeric value is specified as a difference and a tolerance for that difference between two different connection groups. For example, a relative delay of 15 with a tolerance of 2 for a pin pair A-B with respect to pin pair C-D requires that the delay for the route between terminal A and terminal B minus the delay for the route between terminal C and terminal D must be no more than 17 units and no less than 13 units.

Where a constraint instance is of a type of constraint that is specified by a numeric value, the constraint instance may be evaluated in terms of "resources". A "resource value" of a constraint instance is a quantitative value indicating an amount of the constraint's resources that is consumed by its routes. For example, if the sum of the segment lengths for routes of a currently routed net totals 3.5 inches, then the resource value is 3.5. While constraint instances are defined with appropriate units of length, time, voltage, etc., associated therewith, resource values are often defined and stored as unitless quantities.

A "local constraint", as used herein, is a constraint instance that applies to a particular direct connection or some portion of a direct connection. A "global constraint" is any constraint instance that is not a local constraint. For example, any constraint defined on a net or an extended net with more than two terminals is a global constraint. Any constraint defined on a pin pair forming an indirect connection and not a direct connection is a global constraint.

An "interconnect solution" is a set of routes that implement all of the connections and that satisfy all of the constraints.

Essentially all autorouters have mechanisms to support local constraints, although the set of constraint types that each autorouter supports may widely vary from one vendor to another. Such a mechanism, which will be referred to herein as a "convergence strategy", iteratively finds routes for each connection and finds variations for those routes, until all of the required connections have corresponding geometric routes that meet all of the constraints.

An exemplary tool for implementing a typical convergence strategy is that of the traditional Single Connection Router (SCR), which determines a new route for each particular connection. If the SCR uses a geometric representation of the design, then it finds a geometric route. If the SCR uses a topological representation of the design, then it finds a topological route that is later transformed to a specific geometric route. Regardless of the SCR type, the path is determined using a search expansion mechanism, where the search decisions are made in accordance with one or more "cost functions". A cost function computes a numeric value indicative of the level of difficulty of geometrically installing the path in the design, where such value is referred to as a "cost". The typical SCR attempts to find a path with the lowest possible cost.

In some autorouters, the cost functions implemented are very simple, such as is illustrated in FIG. 3A. As is depicted, the cost function returns a zero (0), for example, if the constraint is met, i.e. is below a specified limit, and a one (1) if the constraint is not met, or, in the example, if the value is over the limit. Using the exemplary cost functions, a total cost of 0 implies that all constraints have been met.

Other autorouters use more complex cost functions, such as that depicted in FIG. 3B, to return a very small cost metric if the constraint is met by a wide margin, i.e., under the threshold "X" and a very large value, sometimes referred to as "infinity", if the constraint is far above its limit, i.e., over the threshold value "Z". The complex cost functions may return some midrange values for resource values falling in regions between "X" and "Y" and higher midrange cost metrics for resource values falling between "Y" and "Z". Such cost functions allow for a greater number of choices from which the router may decide a path's trajectory.

Typically, the convergence strategy initializes a set of cost functions and then tasks the SCR to find routes for some or all of the connections in a "routing pass". The cost functions are often modified prior to another routing pass producing thereby an alternative route. The convergence strategy continues executing routing passes until routes are found for all connections that meet all constraints.

Traditional autorouters perform well under local constraints, but they often fail to adequately process global constraints. For example, consider a net X having a constraint instance requiring its six connections to be routed on layers 2 and 3 or on layers 5 and 6. Clearly, a decision must be made as to which pair of layers to use for all connections in the net. In typical autorouters, the SCR would attempt to find paths for each of the connections of the net X allowing use of layers 2 and 3 or layers 5 and 6. Then, it would examine the results and determine the most commonly used pair of layers. For example, it may discover that five of the connections were routed on layer 2 with a total etch length of 8 inches. Further, it might discover that one of the connections was routed on layer 6 with a total etch length of 1 inch. In this case, the layer pair 2 and 3 would be selected and the SCR would reroute the remaining connection using only layers 2 and 3.

The problem with this approach is that a complete interconnect solution might never be found. For example, consider the case where there is congestion around a terminal on both layers 2 and 3 that prevents a connection involving that terminal from being routed on layer 2 or 3. Constraining the entire net X to layers 2 and 3 would make it impossible to complete a connection between the terminals and hence impossible to ever find an interconnect solution.

In another example, consider the routing problem of FIGS. 4A-4D. As shown in FIG. 4A, a net X, shown by its terminal pair A-B at 410, has a length constraint of 5 inches plus or minus 0.01 inches relative to net Y, shown as terminal pair C-D at 420. After a first routing pass, as shown in FIG. 4B, it may be determined that net X is 4 inches long and that net Y is 1 inch long. To meet the constraint, the router might add 2 inches to the connection of net X, as shown in FIG. 4C. However, in future routing passes, it is possible that the route for pin pair C-D might be shoved to make room for some other routes. In order to meet the relative length constraint at that point, an elongation process might be add length to the path for pin pair A-B, as shown in FIG. 4D. This so-called "creep" may result in far longer routes than are actually required by the constraints.

In another approach used in existing autorouters, often referred to as a "greedy" approach, the SCR, and possibly other mechanisms, allow the unrestrained consumption of all unused resources. To illustrate, consider the example of FIGS. 5A-5B, where a net 400 includes terminals A-D, as shown at 415, 420, 425 and 430, respectively. Suppose there is a global constraint on net 400 that requires that no more than two vias on the entire net are allowed. As shown in FIG. 5B, suppose that pin pair A-C receives one via, as shown at 440. The greedy routing procedure would then restrict the other connections of the net to a maximum of one via, since one of the allowed two vias has been consumed. Now, suppose that pin pair B-C used that last via, as shown at 445. In this case, the last connection, pin pair C-D, would be precluded from using any vias and it is entirely possible that the pin pair B-C cannot be routed without one. When this occurs, the autorouter will fail to find an interconnect solution that meets the global constraint.

Traditional approaches in autorouting typically consider global constraints after processing local constraints. For designs with only a small number of constraints, the process converges to a reasonable solution rather quickly. However, as the number of constraints necessary to implement modern designs increases, this strategy is less successful more often.

Thus, given the state of current technology, there is an apparent need for a convergence strategy that allows an autorouter to find routes that implement all of the connections, while also satisfying many different and often competing global constraints.

SUMMARY OF THE INVENTION

In a first aspect of the invention, a method is provided for routing interconnections between terminals in a circuit layout. A global constraint is specified on the placement of routing objects between the terminals such that an interconnect solution for the terminals is obtained only by the placement satisfying the global constraint. A local constraint is determined from the global constraint to constrain placement of the routing objects so as to form a direct route between a pair of the terminals by satisfying the local constraint. The routing objects are then placed to form the route satisfying the local constraint upon a determination that the global constraint has not been satisfied.

In another aspect of the invention, a method is provided for routing interconnections between terminals of a system of at least one design database. A global constraint is specified on placement of routing objects for the system such that an interconnect solution for the system is obtained only by the placement satisfying the global constraint. The global constraint includes a constraint on placement of routing objects forming a plurality of direct routes between a source terminal and a target terminal. At least one local constraint for each direct route is determined from the global constraint to constrain the placement of the routing objects forming the direct route. The routing objects are then placed to form each direct route to satisfy the corresponding local constraint.

In yet another aspect of the invention, an apparatus is provided for routing interconnections between terminals in a circuit layout. The terminals are elements in a system of at least one design database. A memory stores data representing the circuit layout, where such data includes data representing a plurality of terminals and data defining global constraints to constrain placement of routing objects of a connection between a source terminal and a target terminal. A routing engine determines a direct connection path between pairs of the terminals from the source terminal to the target terminal. The direct connection path is formed in accordance with respective local constraints on placement of the routing objects forming each direct connection. The local constraints are derived from the global constraints such that finding an interconnect solution for the plurality of terminals is achieved through finding direct connection paths in accordance with the local constraints.

DETAILED DESCRIPTION OF PREFERRED EMBODIMENTS

Figure 6A:
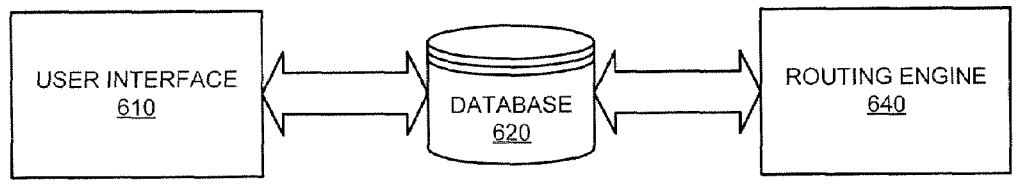
FIGS. 6A-6B are schematic block diagrams illustrating exemplary system configurations suitable for carrying out the present invention.
Figure 6B:
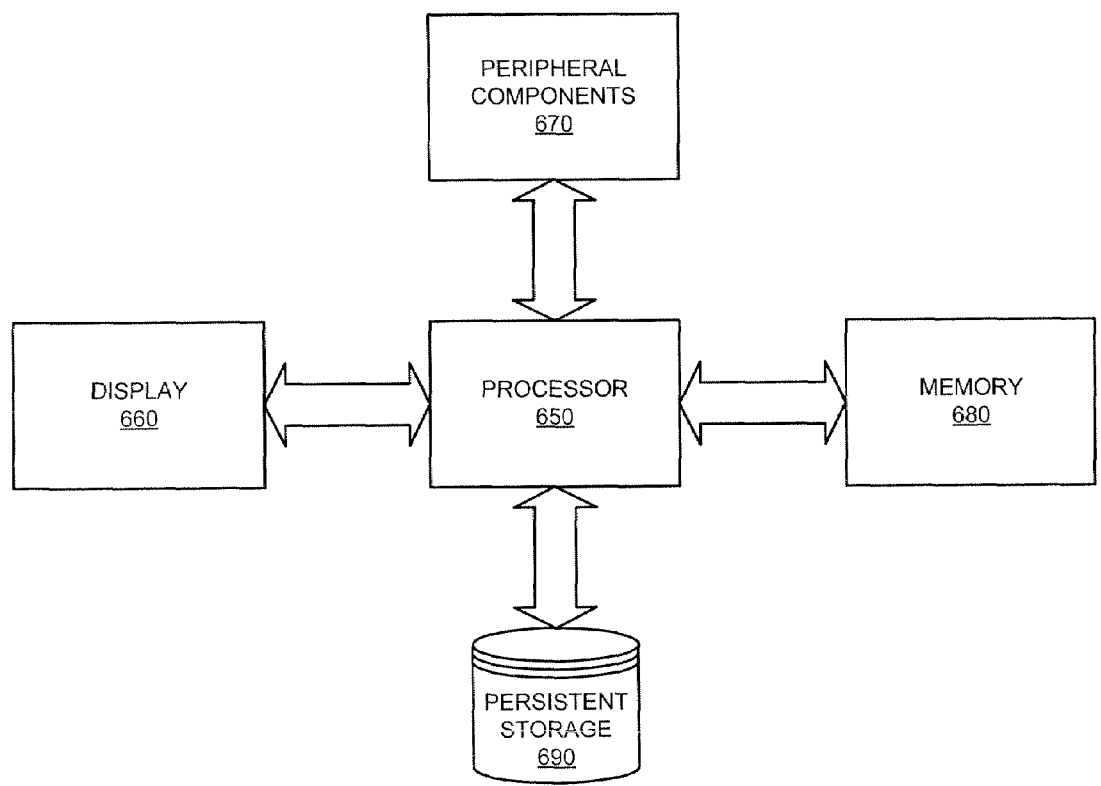

The present invention may be implemented in a plurality of functional modules, such as those shown in FIG. 6A, and implemented on suitable computing hardware, such as that depicted in FIG. 6B. Data objects defining one or more designs and one or more systems are maintained in a database 620. Other data objects include routing objects, such as path segments and vias for forming geometric paths of connections. The design databases contain data for controlling placement of the routing objects, such as constraints and design rules. Database 620 implements a suitable structure on, for example, persistent storage system 690, for retaining data so as to be retrieved by any of numerous data abstractions.

Data objects held within database 620 may be presented to a user as one or more data abstractions through a user interface 610. User interface 610 may be implemented through processor instructions stored in memory system 680 and executed by a suitable processor 650. The user interface 610 may be a graphical user interface operable to display aspects of the design on a display 660 and to allow a user to add, delete and modify features of the design through, for example, manipulation of certain peripheral components 670 coupled to the processor 650. The user interface 610 may also allow control over various functional aspects of the EDA system and may allow a user to perform numerous design tasks, such as schematic entry and manual placement of routing objects.

Routing engine 640 executes path finding routines to determine an interconnect solution for a design in database 620. Routing engine 640 may be implemented through processor instructions stored in memory system 680 and executed by processor 650. The routing engine 640 obtains routing objects and other data objects from database 620 and executes its path finding routines in accordance with the inventive convergence strategy, which is described in detail below.

It is to be understood that the present invention is not limited to any specific router implementation. In an exemplary embodiment, the routing engine 640 searches for paths that can accommodate placement of routing objects between terminals so as to form a route for the connection at a minimum routing cost. For purposes of description and not limitation, the exemplary routing engine 640 searches for the minimum cost connection path by expanding the route from the source terminal to the target terminal, making an expansion decision at numerous points along the path. The lowest cost expansion is selected at each decision point to forward the path for the connection. A suitable SCR that fills this description may be used in embodiments of the invention. However, other routing engine configurations may also be used, including routers that first determine a topological route prior to placing a corresponding geometrical route.

In accordance with the invention, the routing engine 630 expands the path from one terminal to another terminal, where the pair of terminals forms a direct connection, to satisfy the local constraints associated with that direct connection. The routing engine 640 routes the connections to satisfy the global constraints, but using only the local constraints in the path-finding processes. The global constraints themselves are ignored by these processes.

Figure 7:
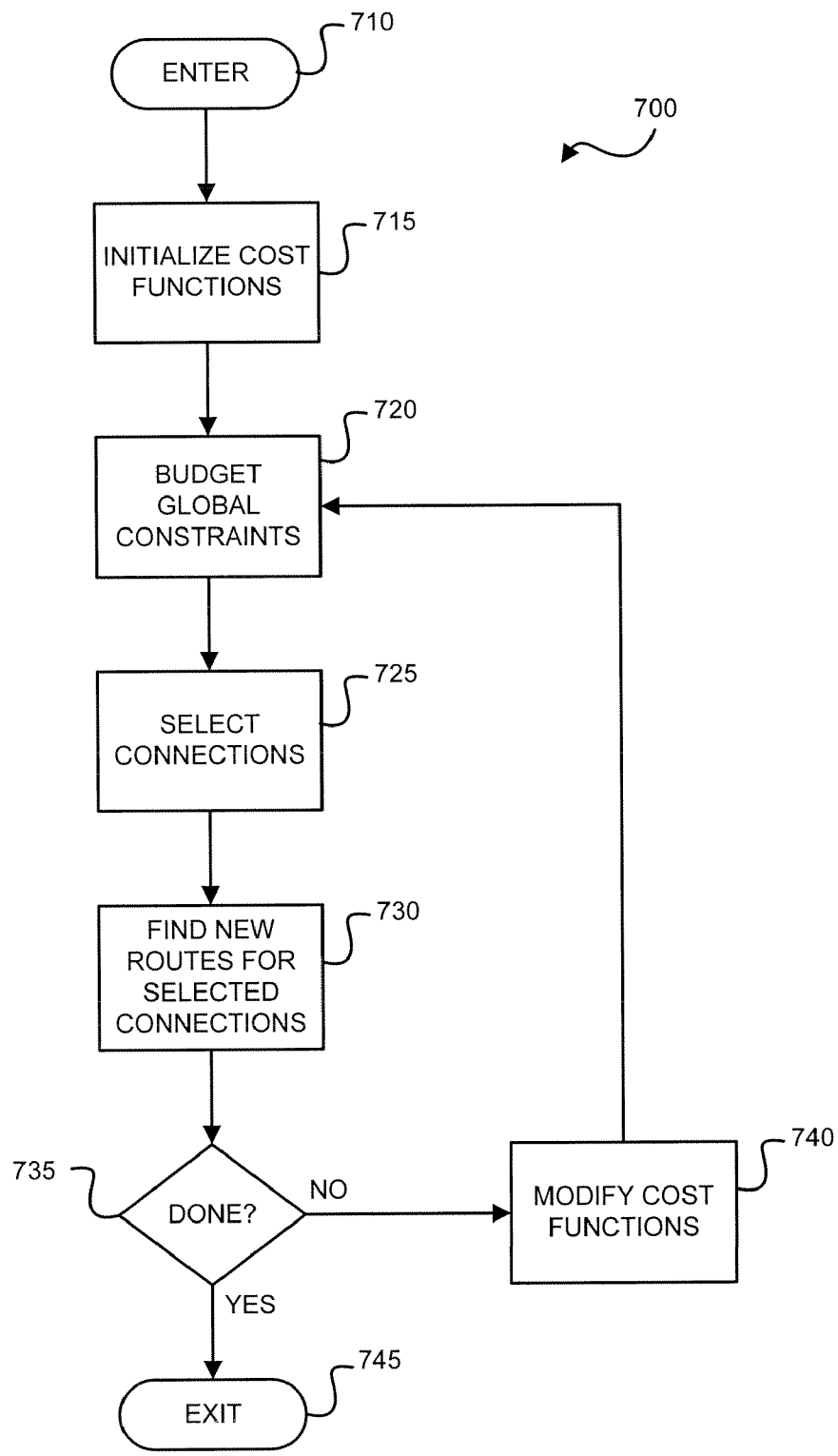
FIG. 7 is a flow diagram illustrating a convergence strategy consistent with the present invention.

Referring to FIG. 7, there is shown a flow diagram of an exemplary convergence strategy 700 consistent with the present invention. The process is entered at block 710 and the flow proceeds directly to block 715, whereby certain of the cost functions used in the path-finding processes are initialized. However, as will be described below, cost functions for certain local constraints are initialized at the time the local constraint is instantiated.

In accordance with the present invention, the convergence strategy 700 includes a process referred to herein as "global constraint budgeting", or simply "budgeting". Before or after each routing pass, the global constraint budgeting step 720 is executed to determine if any global constraints remain unsatisfied and if so, a special local constraint referred to herein as a "budget" is either instantiated, if one has not been instantiated, or is modified. The budgets act in a manner consistent with traditional local constraints with the exceptions that they are not defined by the user and are modified by a subsequent global constraint budgeting process. For each type of constraint, a process specific to constraint instances of that type is used to budget the constraint, as will be described further below. In accordance with the exemplary convergence strategy 700, all global constraints are evaluated in process 720 and if any of the global constraints remain unsatisfied, the budgeting process for that type of constraint is executed.

The convergence strategy 700 then proceeds to block 725, whereby the routing engine 640 begins a routing pass. Connections that are to be routed are selected at block 725 and the convergence strategy 700 then proceeds to block 730, whereby the routing engine 640 finds new paths for the selected connections. The routing pass is considered completed once the route finding step 730 has terminated. It is then determined at block 735 if all connections have been routed to meet all of the global constraints. If so, the convergence strategy 700 exits at block 745. If, however, it is determined that other connections are to be routed or that any of the connections that have been routed do not satisfy the global constraints, the cost functions associated with the budgets, and any other cost functions that are not budget-based, are modified in block 740. The cost functions are modified to seek improvement in path-finding results when subsequent routing passes are conducted. Examples of such modification to improve budgeted constraints are described below. Upon completion of the cost function modifications, the convergence strategy 700 returns to the budgeting process 720 and another routing pass is performed. The process iterates until routes are found for all connections that meet all constraints.

Figure 8A:
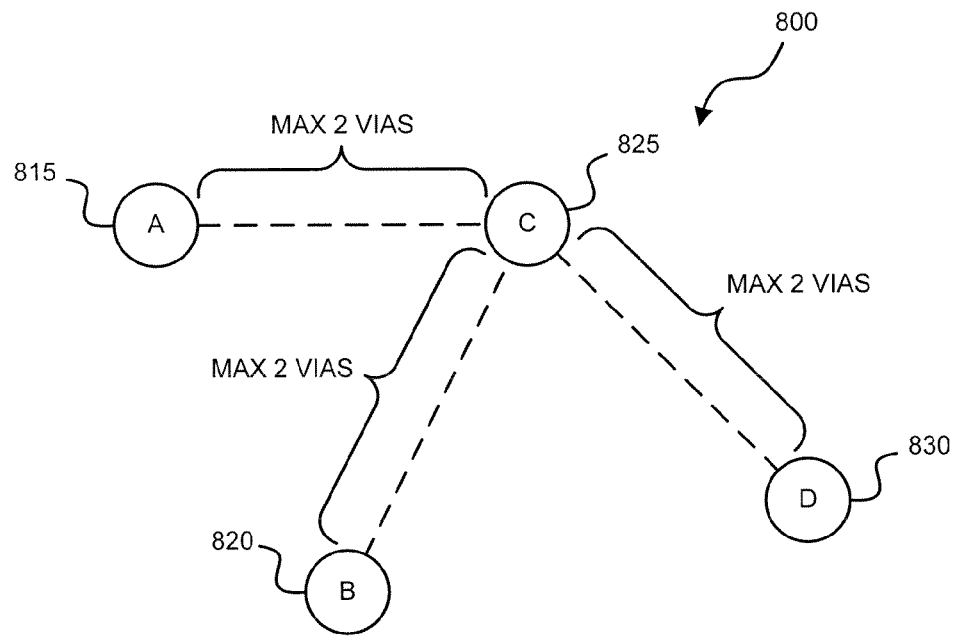
FIGS. 8A-8D are diagrams illustrating benefits of the present invention as compared to the greedy resource allocation example of FIGS. 5A-5B.
Figure 8B:
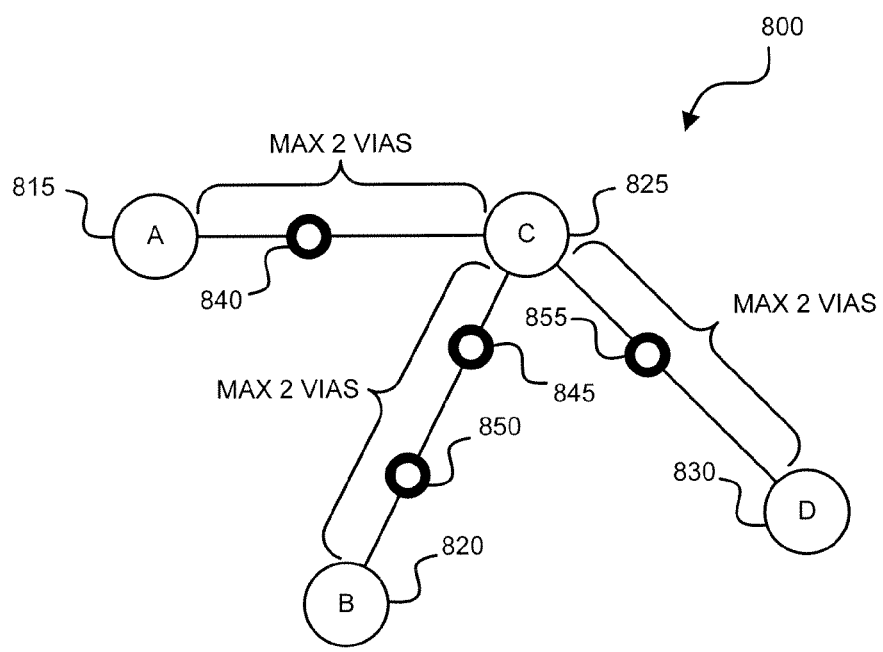
Figure 8C:
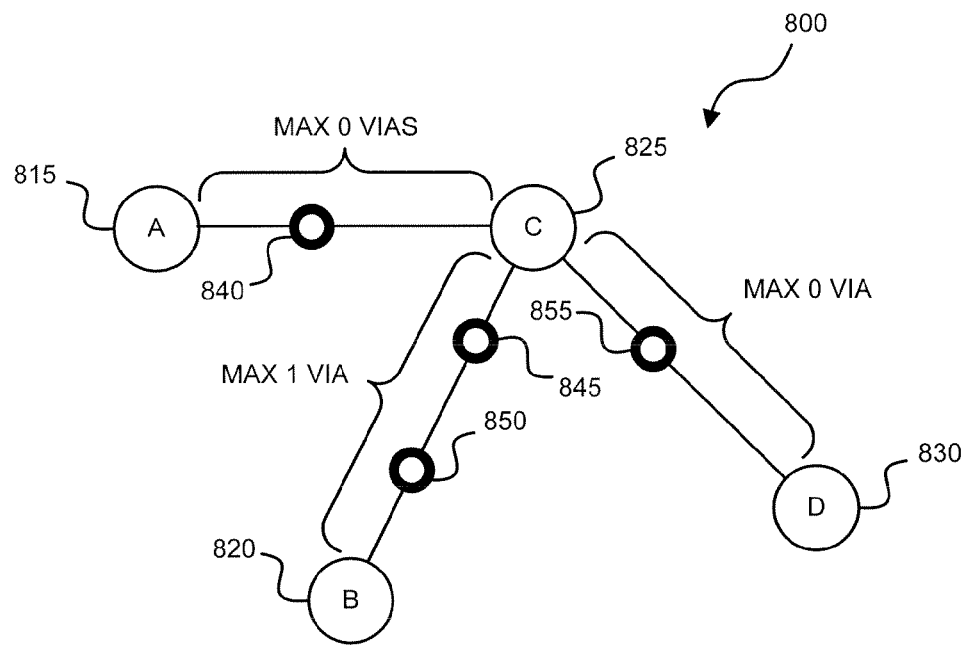
Figure 8D:
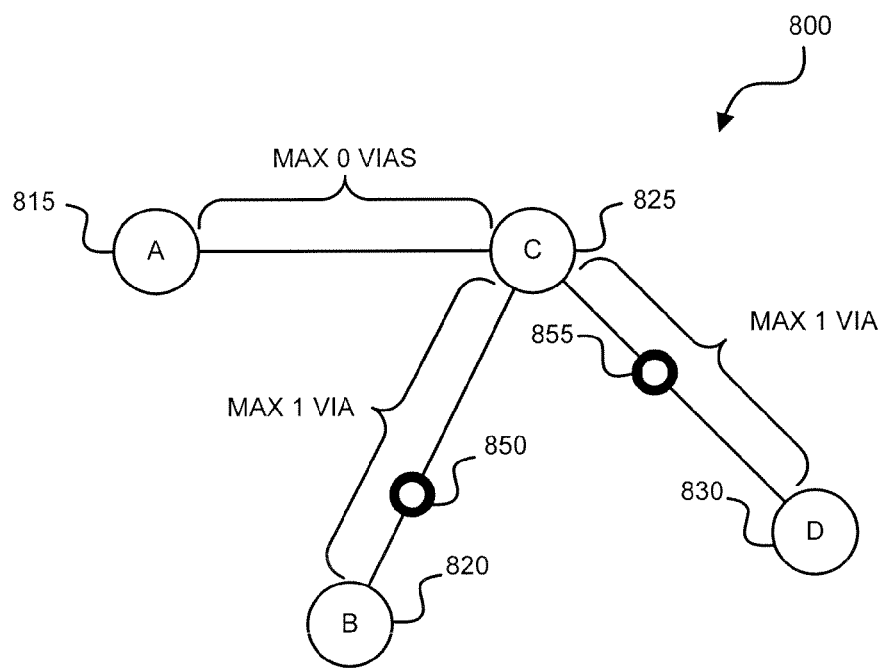

Referring to FIGS. 8A-8D, there is illustrated certain benefits of the present invention. The net 800 illustrated in the Figures includes four terminals A, B, C and D, illustrated at 815, 820, 825 and 830, respectively. For comparison with the prior art, the same constraints described and applied in the example of FIGS. 5A-5B will be applied to the present example of FIGS. 8A-8D. Specifically, it is specified that the net 800 is allowed to have a maximum of two vias on the entire net. In accordance with the invention, the global constraint budgeting process is executed prior to any routing pass. To allow the greatest latitude in early path-finding attempts, the budgeting process 720 instantiates a budget of two vias on each direct connection A-C, B-C and C-D, as is shown in FIG. 8A. After one or more routing passes, the global constraint budgeting process is again executed and, as is shown in FIG. 8B, it is discovered that four vias exist on the net, which clearly is non-compliant with the global constraint. Thus, budgeting process 720 reduces by one the routing resource that each connection currently contains. FIG. 8C illustrates the modified budgets prior to other routing passes, where the budget for pin pairs A-C and C-D are modified to allow zero vias and the budget of pin pair C-B is modified to allow one via. With this budgeting assignment, several routing passes are again executed and the path-finding routines search for paths that satisfy the budget constraints. After several routing passes, two of the vias are removed. After running more routing passes, the global constraint budgeting process 720 will have modified the budgets to the exact number of vias that each connection has shown in FIG. 8D, which is a routed net that meets the global constraint. If, after additional routing passes, it is determined that a via is required on a direct connection in the net after the global constraint has already been satisfied, the budget process determines what placed via may be moved to accommodate the direct connection requiring that via. Thus, the convergence strategy 700 is aware of and manages global constraints by creating and manipulating local constraints.

Figure 1A:
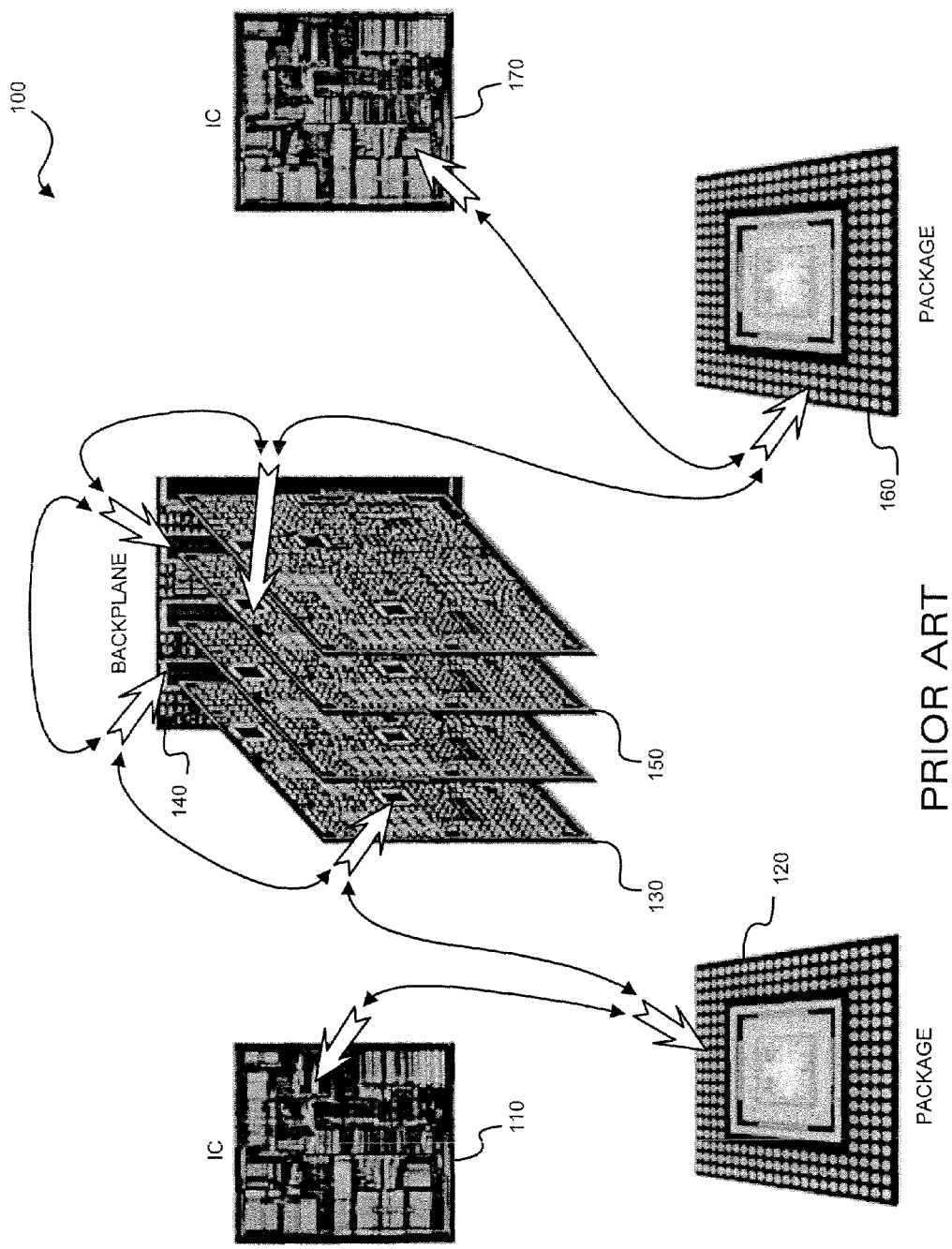
FIG. 1A is an block diagram of a set of circuits, the designs for which form a system of designs.
Figure 1B:
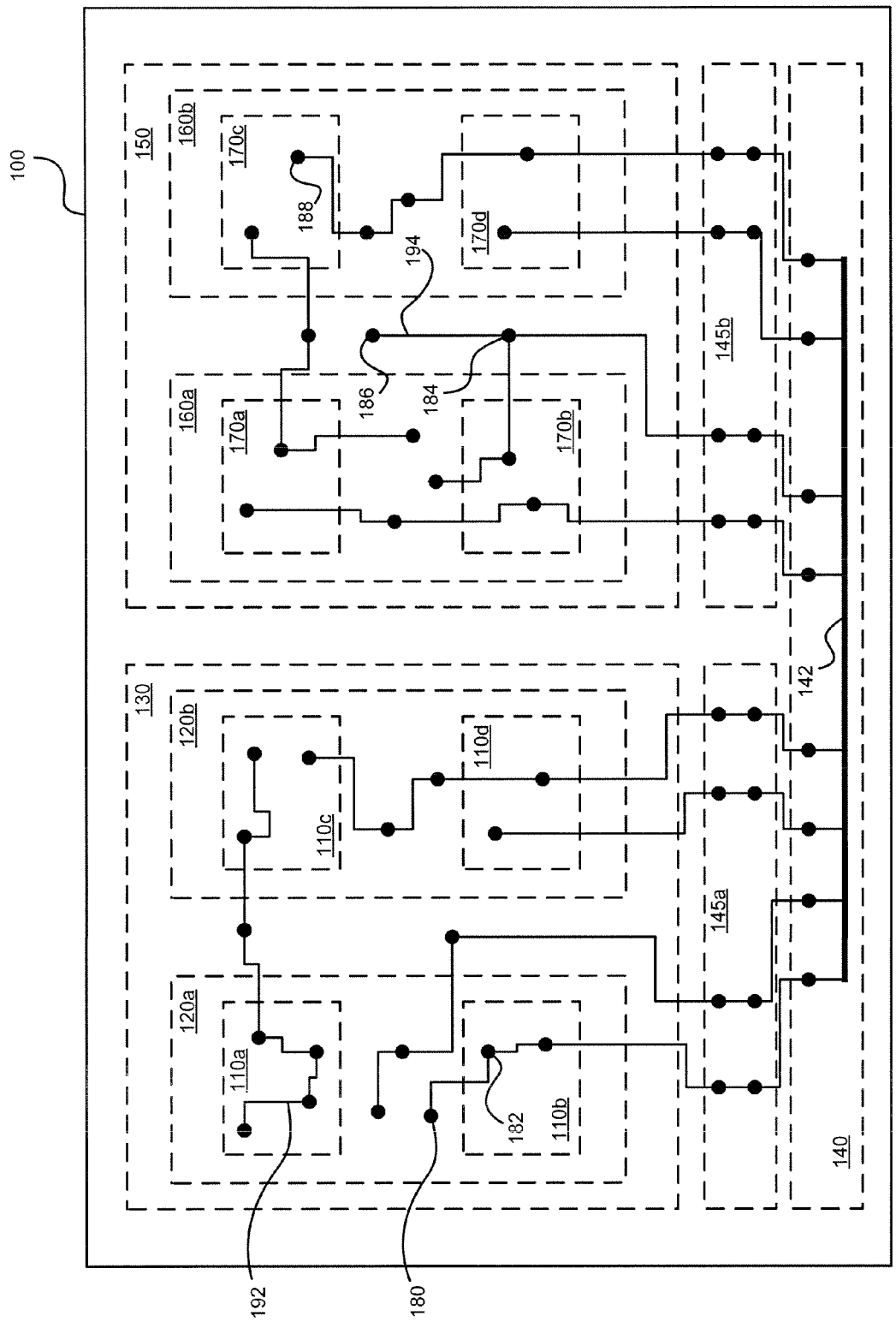
FIG. 1B is a schematic block diagram of the system of FIG. 1A showing various terminals and connections.
Figure 2A:
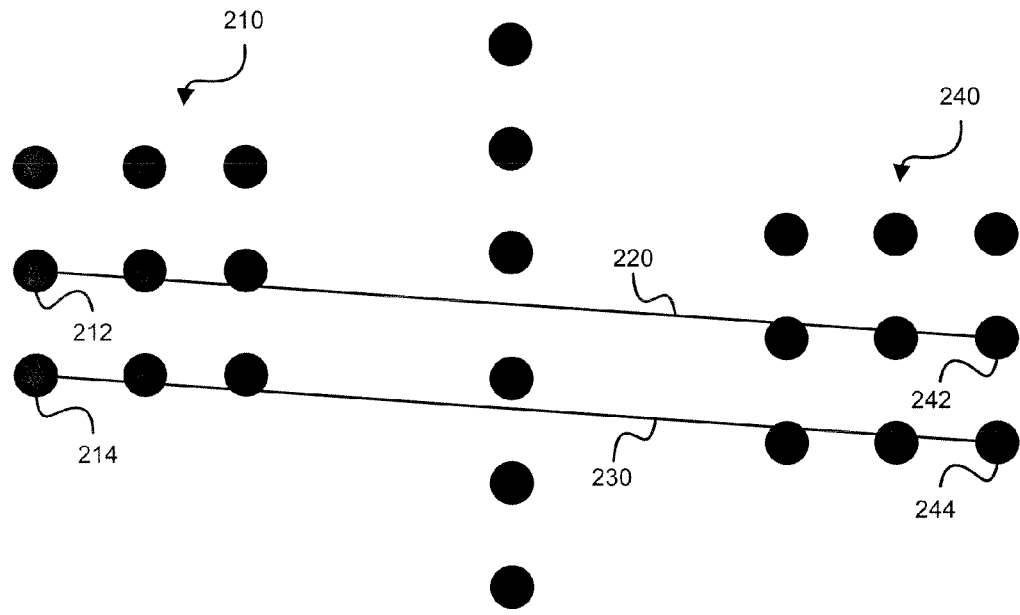
FIGS. 2A-2B is a diagram illustrating the traditional use of terminals, components, connections and routes.
Figure 2B:
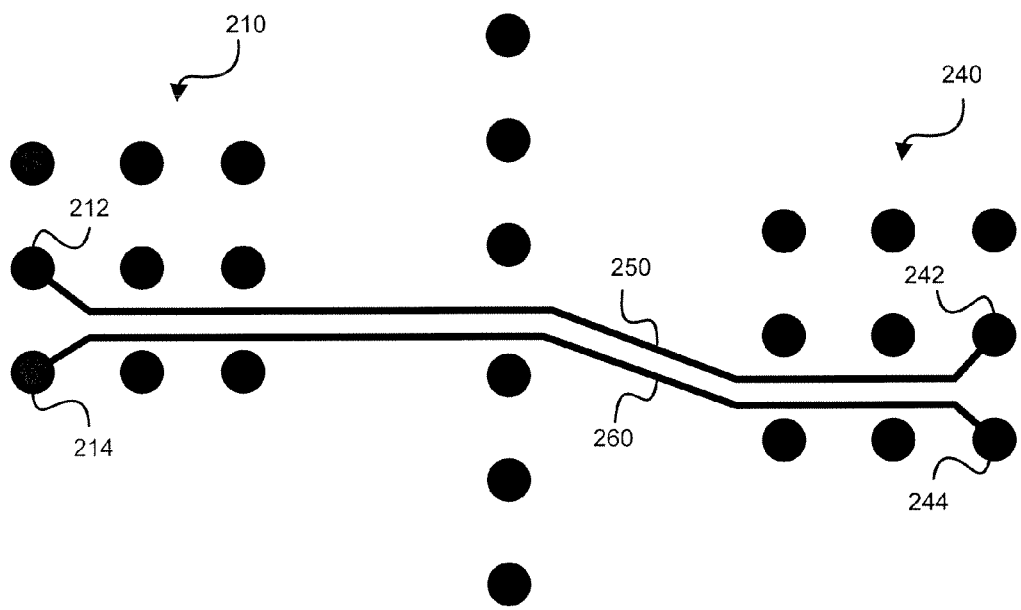
Figure 3A:
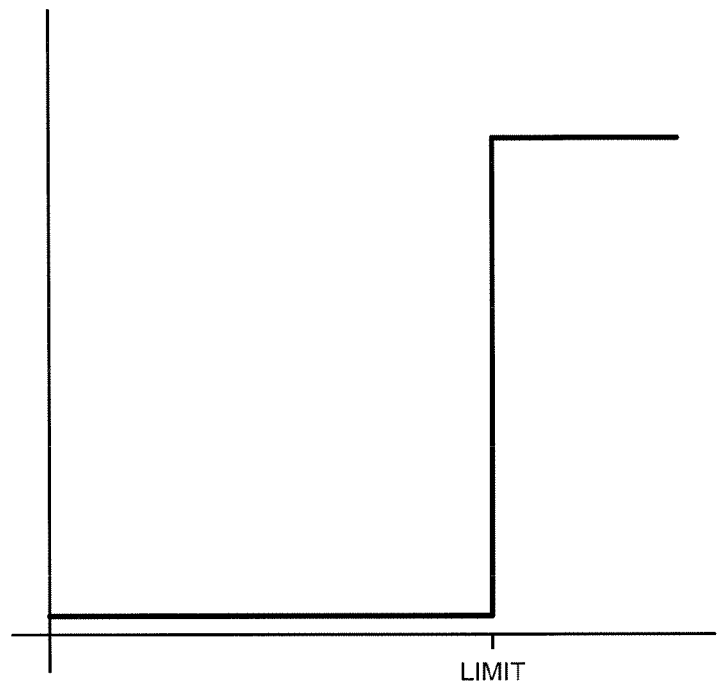
FIGS. 3A-3B are graphs illustrating certain cost functions of the prior art.
Figure 3B:
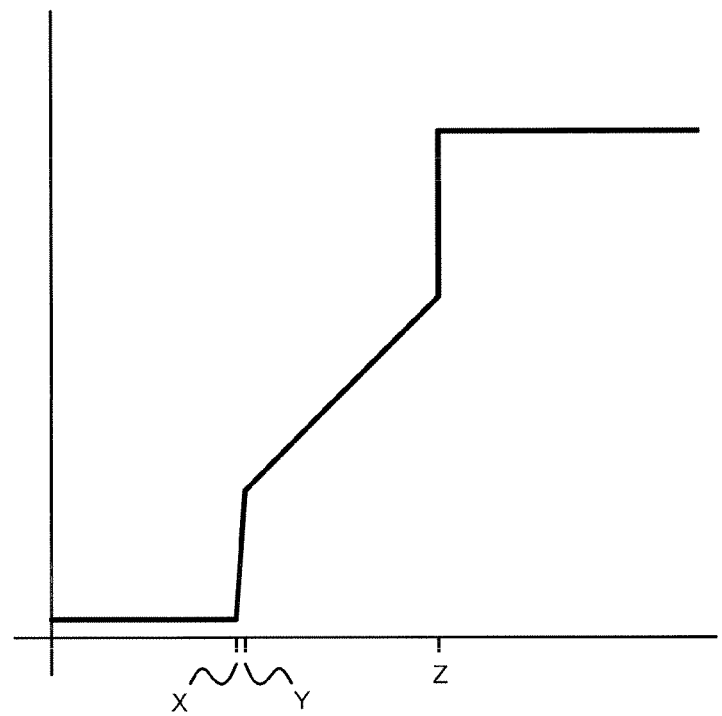
Figure 4A:
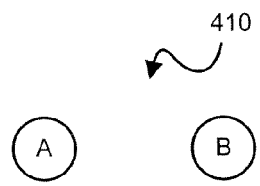
FIGS. 4A-4D are diagrams illustrating undesirable creep in attempting to meet global constraints in the prior art.
Figure 4A:
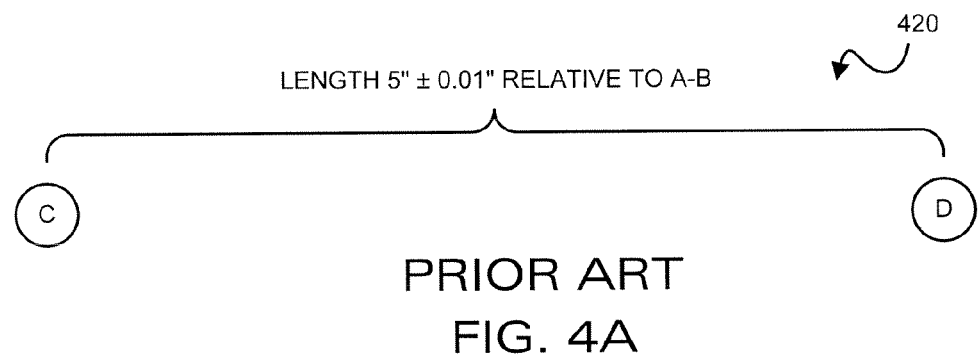
Figure 4B:
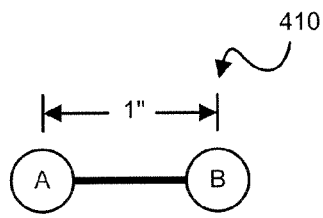
Figure 4B:
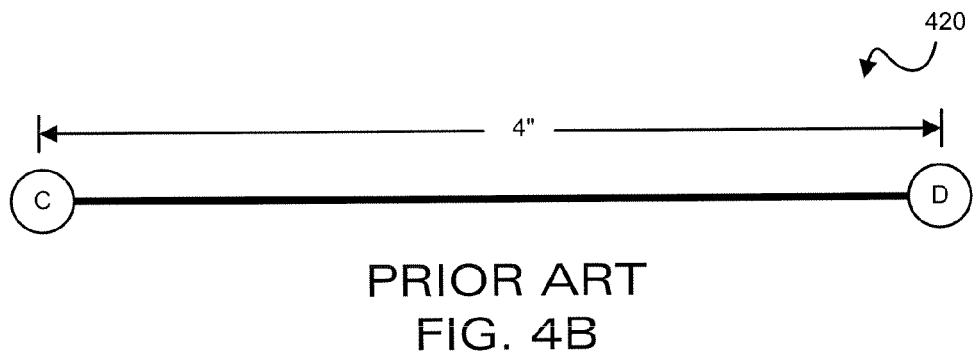
Figure 4C:
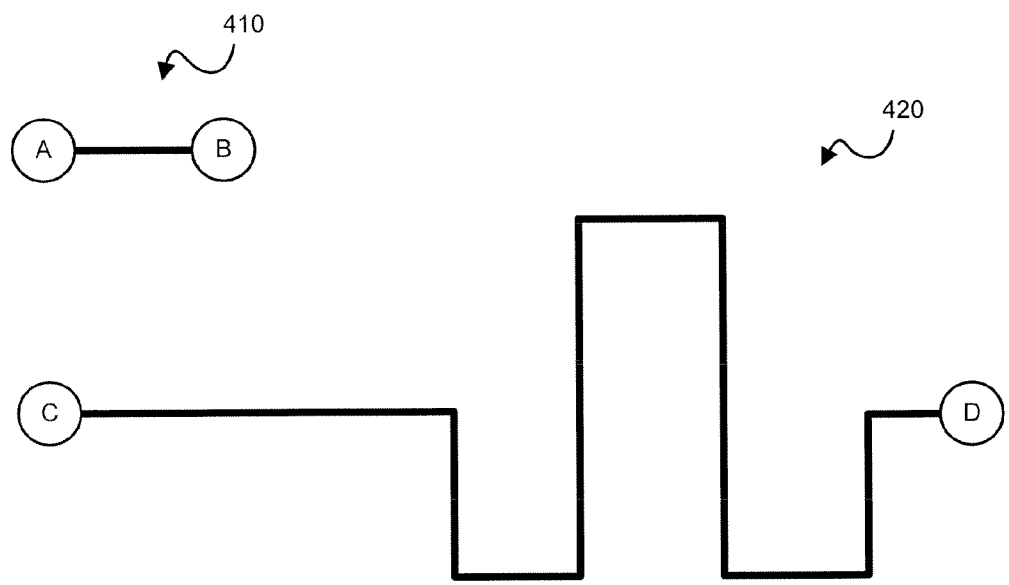
Figure 4D:
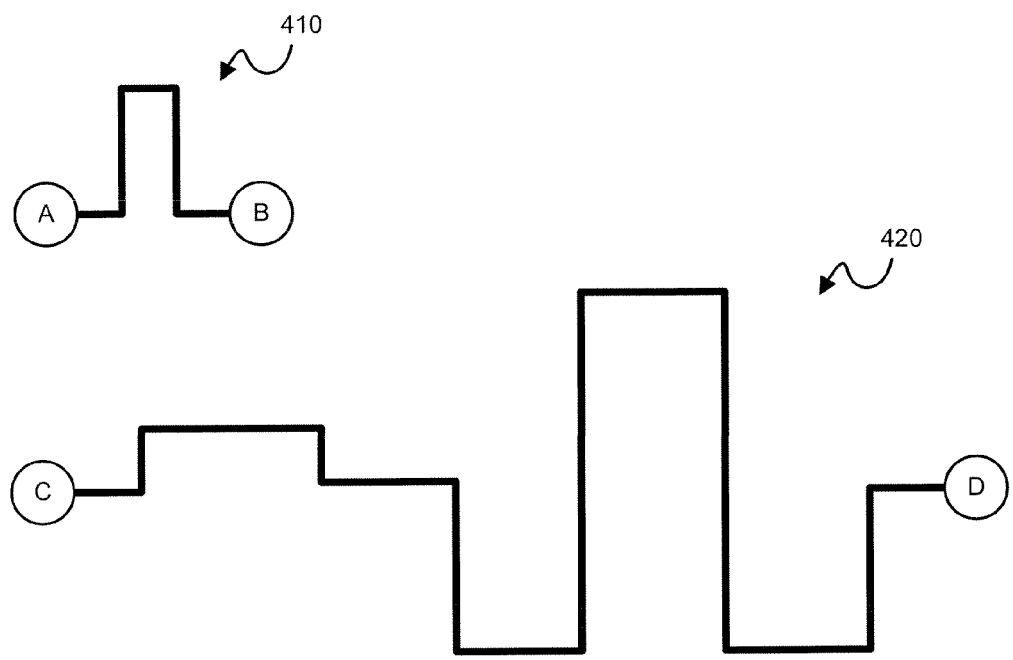
Figure 5A:
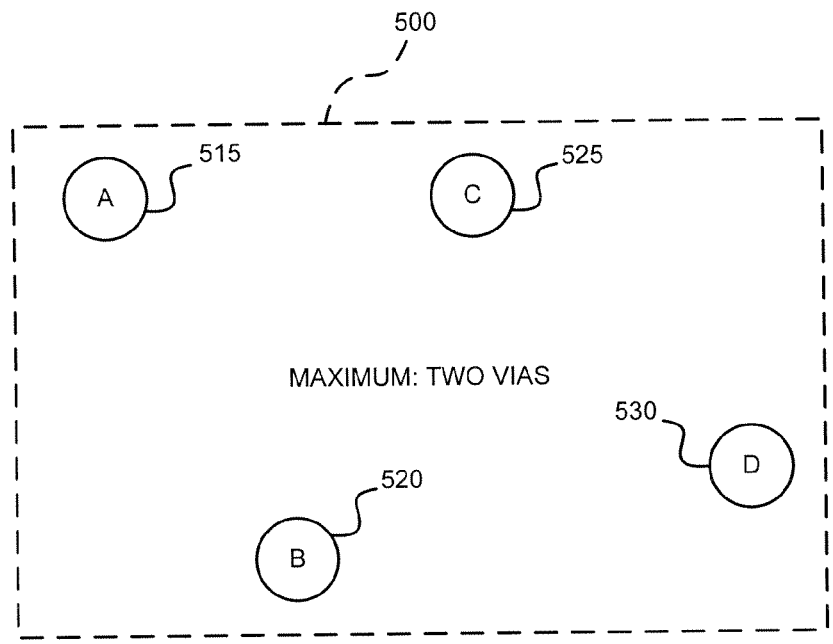
FIGS. 5A-5B are diagrams illustrating undesirable artifacts of greedy resource allocation in the prior art.
Figure 5B:
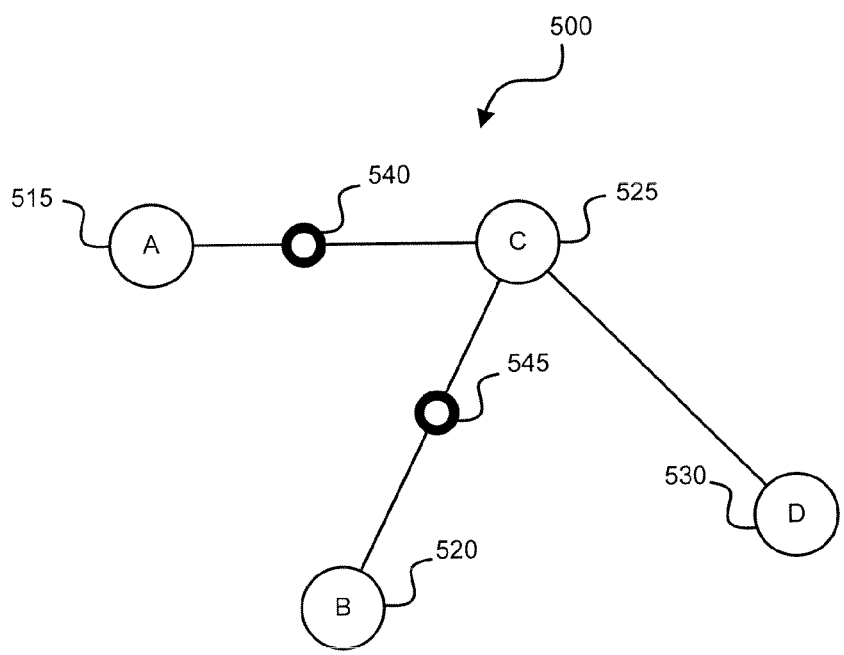

It is to be noted that the greedy routing procedure described with reference to FIGS. 5A-5B consumed all vias allowed on the net and could not route a connection when an additional via was required. As described above, the routed configuration of FIG. 5B could not provide a via to the pin pair C-D, because all resources had been consumed. In contrast, the present invention adapts its budgets in accordance with local requirements, while adhering to the global requirements established by the global constraints. Thus, the direct connection of C-D received a via when it was determined that such was required to route the connection.

Figure 9:
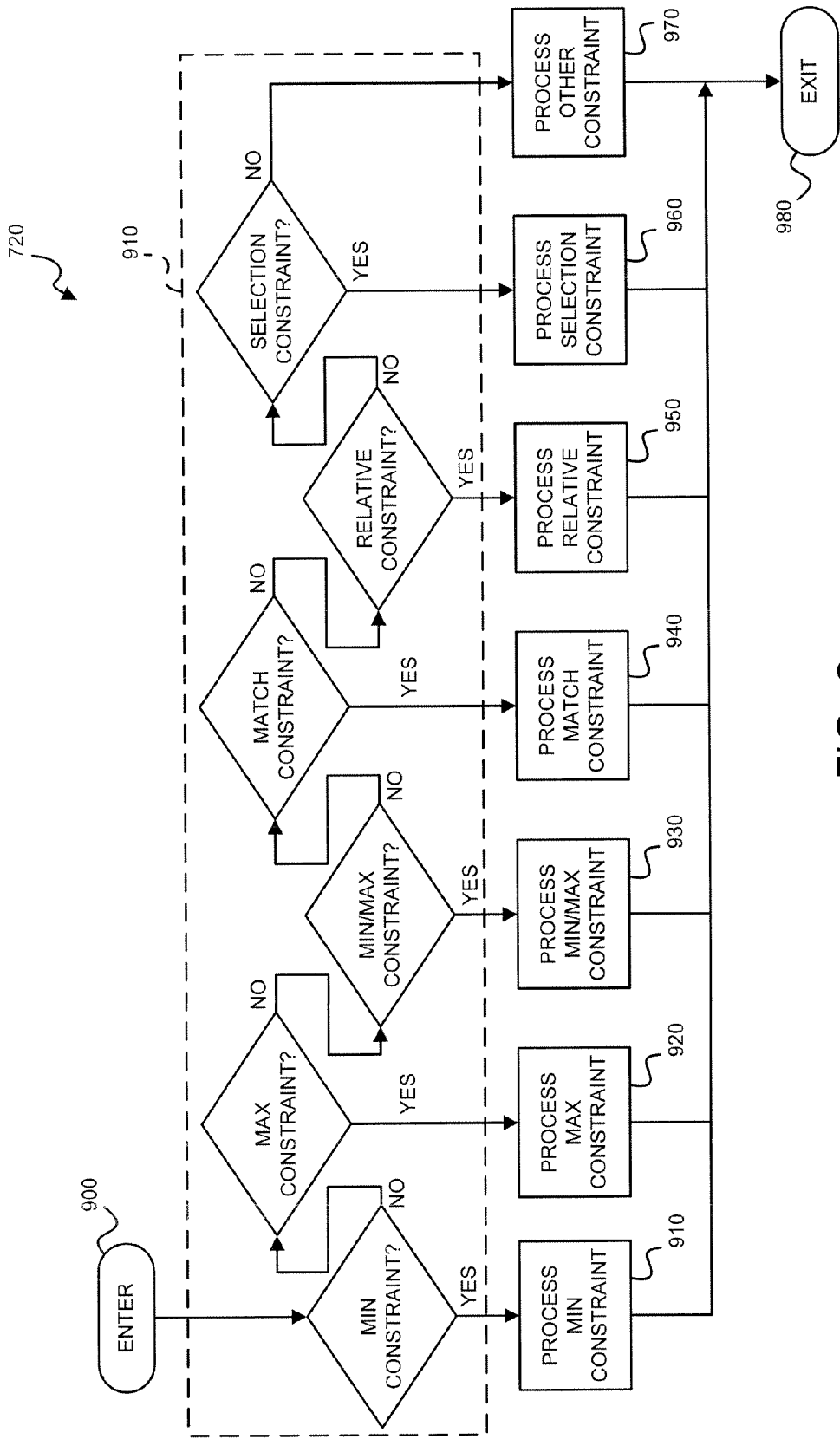
FIG. 9 is a flow diagram of an exemplary constraint budgeting process consistent with the present invention.

Referring now to FIG. 9, there is shown a flow diagram of an exemplary budgeting process 720. After entering process 720 at block 900, it is determined through a test block 910, what type of constraint is being budgeted and a budgeting process specific to that type of constraint is then executed. If a min constraint is being budgeted, the min budgeting process 910 is executed. If it is determined that a max constraint is being budgeted, the max constraint budgeting process 920 is executed. For a min/max constraint, the min/max constraint process 930 is executed. For a match constraint, the match constraint process 940 is run; for a relative constraint, a relative constraint budgeting 950 process as run. If it is determined that a selection constraint is being budgeted, the selection constraint budgeting process 960 is executed. Other constraints are considered to fall within the scope of the present invention and the budgeting process of such is included as process 970. The budgeting process 720 is exited at block 980.

Figure 10:
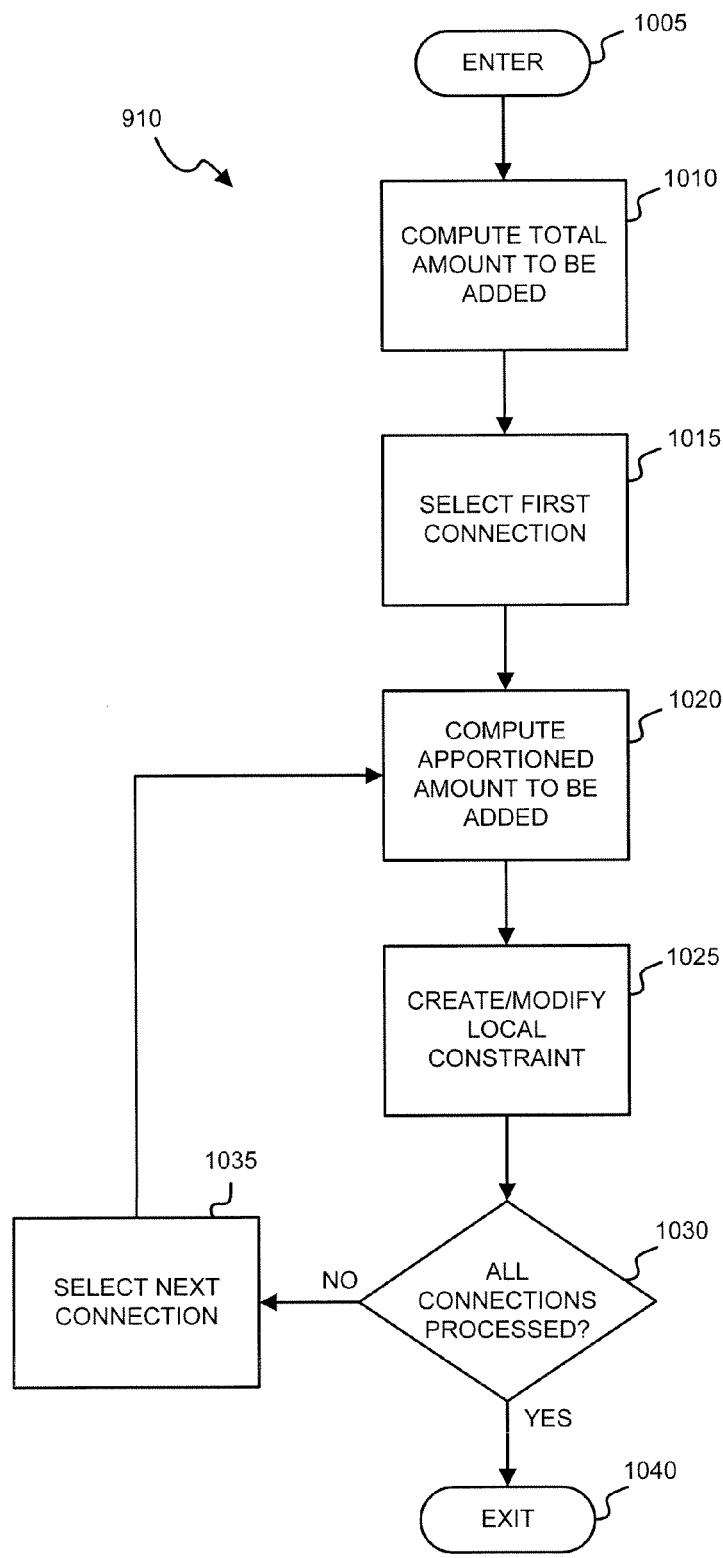
FIG. 10 is a flow diagram illustrating certain process steps of a min constraint budgeting process consistent with the present invention.

Referring to FIG. 10, there is shown an exemplary min constraint budgeting process 910, which is executed whenever the current amount of routing resource is less than the minimum amount required by a global constraint. For example, when the length of a routed connection is to be at least a certain length, and the current length is shorter than the required length, the min constraint budgeting process would apply budgets to the direct connections so as to extend the overall length of the route.

The min budgeting process 910 is entered at block 1005 and flow transfers processing to block 1010, whereby a total amount of resource that is to be added is determined. For example, if the constraint instance specifies a minimum length of 5 and the current length is 3, then the total amount to be added is 2. The min constraint budgeting process 910 then proceeds to block 1015, whereby a first direct connection is selected. Subsequently, in block 1020, an apportioned amount of the unmet resource is computed for the selected direct connection. In certain embodiments, the apportioned amount for each direct connection is determined specifically for the direct connection in accordance its current resource value. For example, if the total amount of resource to be added was 2 and the selected direct connection accounted for 40% of all current total resources used in the connection, then the apportioned amount budgeted for the selected direct connection would be 0.8, i.e., 2×0.4=0.8.

Upon determining the apportioned amount at block 1020, process 910 proceeds to block 1025, where the budget is created, if one has not been created, or modified if a budget was already instantiated in an earlier routing pass. The budgeting constraint instance would be provided with a cost function that is, for example, very large for values lower than the current amount of resource used for this direct connection; large for values between the current amount of resource and the current plus apportioned amount; small for values between the current amount plus apportioned amount and the current amount plus total amount; and very small for values higher than the current amount plus total amount. The routing engine 640 then bases path expansion decisions for the corresponding direct connection on cost metrics returned by the cost function associated with the budget.

Figure 13A:
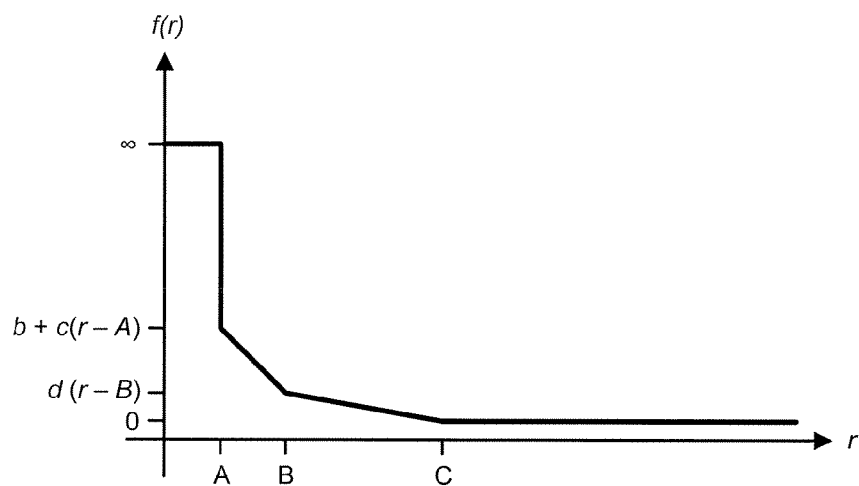
FIGS. 13A-13C are graphs illustrating exemplary cost functions consistent with the present invention.

Any of numerous functions that meet the cost criteria may be used with the present invention, such as those whose profile is defined by an S-curve. The cost function may be programmed into processing instructions and executed on a suitable processor, such as processor 650. In certain embodiments of the invention, the cost function is a Piece Wise-Linear (PWL) function defined by parameters on four subintervals, such as is shown in FIG. 13A. The exemplary cost function may be evaluated as:

$$f(r) = \begin{cases} \infty, & r \leq A \\ b + c(r - A), & A \leq r < B \\ d(r - B), & B \leq r < C \\ 0, & C \leq r \end{cases},$$

where r is the amount of resource to be scrutinized by the routing engine 640 during the subsequent routing passes, A is the current amount of resource used by the direct connection, B is the current amount plus the apportioned amount added, C is the current amount plus the total amount added, b, c, and d are values to meet desired convergence criteria and ∞ is a very large number. Variables b, c and d may be constant or may be assigned values based on a current routing state, such as the number of routing passes already run, the current completion status, the number of repeated failures to satisfy the particular global constraint, etc. The values for A, B and C (and b, c and d, in certain embodiments) may be updated as needed in the cost function modification step 740 to impart the desired budget for the direct connection to the routing engine 640 at each routing pass.

In certain embodiments of the invention, multiple cost functions may be assigned to a particular budgeting constraint instance. For example, the budget could have a "compliance" level, a "strong goal" level and a "weak goal" level, all of which would have a suitable cost function respectively assigned thereto. The compliance function may return a Boolean response, such as a "yes" when the local constraint has been satisfied, e.g., greater than A in the exemplary cost function described above, and a "no" when the constraint has not been met, e.g., less than A. The strong goal function may return a cost that directs the routing engine 640 to use the apportioned amount of resource for the direct connection, e.g., a large value for resource amounts less than B and a small value for resource amounts greater than B. The weak goal function may return a cost value that directs the routing engine 640 to use the total amount of resources, e.g., a large value for resource amounts less than C and a small value for resource amounts greater than C.

Figure 13B:
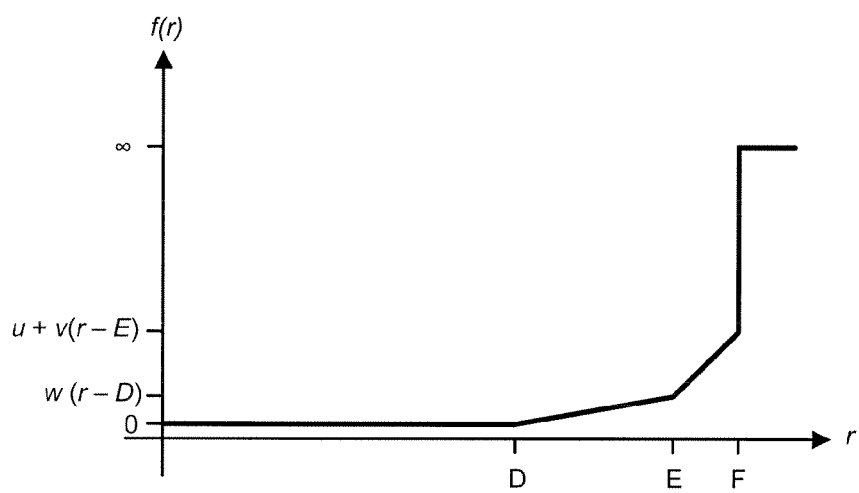

Constraints that specify a global maximum are handled in a manner similar to the mm constraint example previously described, except that the total amount and the apportioned amount are subtracted from the current amount of resource, rather than added to the amount. That is, in step 1010, a total amount to be removed would be computed and in step 1020, the apportioned amount to be removed would be computed. A cost function for a max constraint may be computed through processing steps that implement:

$$f(r) = \begin{cases} 0, & r \leq D \\ w(r-D), & D \leq r < E \\ u + v(r-E), & E \leq r < F \\ \infty, & F \leq r \end{cases},$$

where F is the current amount of resource used, E is the current amount of resource minus the apportioned amount to be added, D is the current amount minus the total amount of resource to be added, u, v and w are values for purposes of controlling convergence, and ∞ is a very large number. A PWL function implementing the cost function for a max constraint is shown in FIG. 13B.

A min/max constraint is any type of constraint that specifies both a global minimum and a global maximum. This constraint may be treated as either a min or a max constraint, that is, if the route for a direct connection subject to a min/max constraint is currently using too much routing resource, then the max constraint budgeting process is applied. Similarly, if a route is currently using too little routing resource, then the min constraint budgeting process is applied. However, the application of alternating min and max budgets may ultimately lead to a "ping-pong" effect, where the resource exceeds a max constraint in one routing pass and then fails to meet a min constraint in another routing pass, then goes over its max, and so on. Embodiments of the invention may therefore associate a min/max cost function to the budget that concurrently implements both minimum and maximum selection logic, such as the exemplary cost function illustrated in FIG. 13C. In the depicted cost function, the linear segments are defined in a manner similar to the corresponding min and max cost functions described above and may be modified in the cost function modification process 740 at each routing pass to converge on a route without the aforementioned ping-pong effect. The values $V_1$-$V_4$ may be established by proper assignment of the values a-d and u-w described above.

Figure 11:
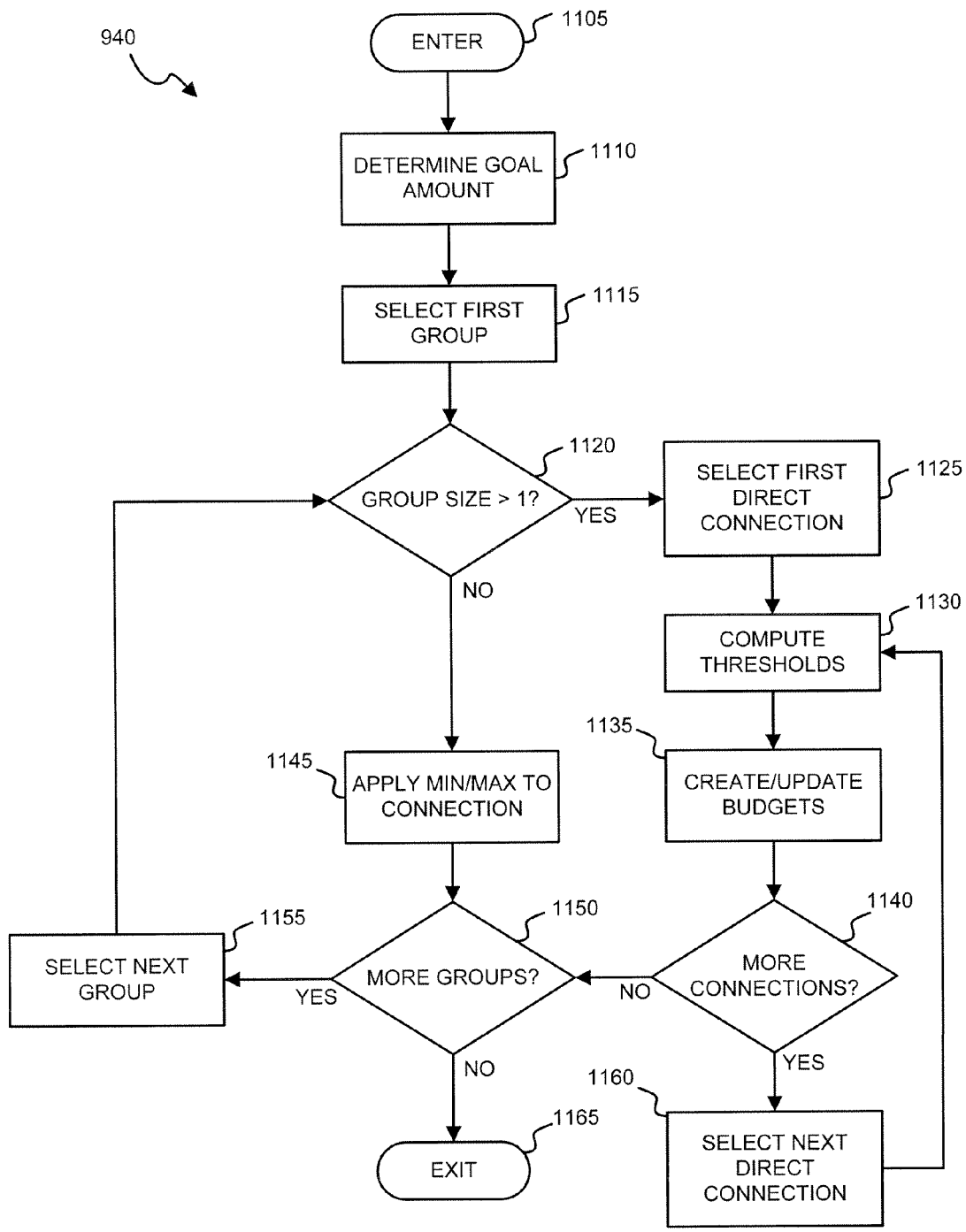
FIG. 11 is a flow diagram illustrating certain process steps of a match constraint budgeting process consistent with the present invention.
Figure 13C:
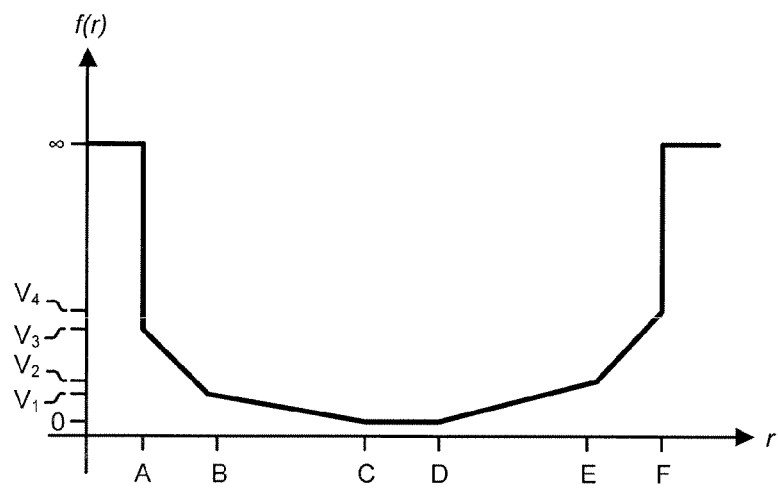

A match constraint is any type of constraint that specifies only the difference between the minimum and maximum values for two or more connection groups. An exemplary match constraint budgeting process 940 is illustrated in FIG. 11. The process 940 is entered at block 1105 and process flow proceeds to block 1110, where a "goal" amount is determined. The goal amount defines a target amount of resource against which the difference is measured. One method for selecting a goal is to determine what the minimum and the maximum values of the resource are in the connection groups affected by the match constraint and then selecting some median value. Another method would find the average value for all of the connection groups affected. However, using these techniques, extreme high or low values may skew the amount of resource used in the routed connection groups. Thus, in certain embodiments of the invention, the goal amount may be computed as a weighted sum:

$$g \equiv \frac{\sum_{i=1}^{n} w_i v_i}{n},$$

where g is the computed goal, n is the number of connection groups affected by the global constraint, $v_i$ is the current resource value for group i and $w_i$ is a weight assigned to group i. By using the weighted sum, the influence of any particular value may be controlled. For example, supposing that four nets A, B, C and D did not satisfy a match constraint after five routing passes and, in all five of the previous attempts, the budget for nets A and C were met, but the budget of net B was not met in the last routing pass. Supposing further that the budget for D was not met in any of the five routing passes, then the weights $w_i$ might be 1, 2, 1 and 5, for nets A, B, C and D, respectively. By tracking the routing status and applying the historical data to the computation, the goal value may be biased toward values that are the most difficult to increase or decrease. Once the goal has been obtained, the target resource value for each group may include the range of values centered on the goal and extending therefrom by a tolerance amount in each direction. To bias routing by the routing engine 640 towards the goal, the match constraint budget may be associated with a min/max cost function as shown in FIG. 13C, where threshold values C and D may be set to coincide at the goal value.

Once the goal value has been established, the match budgeting process 940 selects a first connection group, at block 1115, and determines at block 1120 if the connection group contains more than one direct connection. If not, the process flows to block 1145, where a min/max budget with appropriate values assigned to the cost function variables A-F is applied to the connection. If, however, there is more than one direct connection in the connection group, then each connection is assigned a match constraint budget. At block 1125, a first direct connection is selected and threshold values are computed for the min/max cost function, as described above at block 1130. The budget for the connection is created at block 1135 using the configured cost function or, if a budget has already been created, it may be updated by appropriate manipulation of the threshold values A-F. If more connections are to be budgeted, as determined at block 1140, the next direct connection is selected at block 1160 and the process returns to block 1130.

Once all direct connections in the connection group have had budgets applied, it is determined at block 1150 if more connection groups have yet to be budgeted. If not, the process exits at block 1165. If there are more connection groups, the next connection group is selected at block 1155 and the process returns to block 1120.

The budgeting process 950 for a relative constraint is similar to that of the match constraint, except that a reference value is established in the relative constraint. The computation of the goal value must take into account the reference value for the connection group, i.e., for each connection group, the reference offset must be subtracted. This may be achieved through a weighted sum:

$$g \equiv \frac{\sum_{i=1}^{n} w_i (v_i - r_i)}{n},$$

where $r_i$ is the reference offset value and the remaining variables in the weighted sum are as those described for the match constraint above.

To illustrate the relative budgeting via a numerical example, consider $G_1$, $G_2$, $G_3$ and $G_4$ as four connection groups. Suppose that $G_3$ and $G_4$ must both be 5 larger than $G_2$ and that $G_1$ must be 2 larger than $G_2$. One of the connection groups is selected as a reference group, for example $G_1$, which, by definition, then sets $r_1=0$. $G_1$ must be 2 larger than $G_2$, so $r_2=-2$. $G_3$ must be 5 larger than $G_2$, which must be 2 less than $G_1$, thus establishing $r_3=3$ and $r_4=3$.

Although the connection groups could have equal weights $w_i$, certain useful embodiments bias the weights based on the number of connection groups that reference a particular group. In the example above, $G_1$ and $G_3$ are both referenced by two groups and may be given twice the weight accordingly.

The reference offset in relative budgets must be considered when the budget is applied to each group. That is, the value g is the goal value, but the corresponding reference offset must be carried through to each connection group. For example, the goal resource value for $G_4$ described above would be g+3. The cost function would then be configured as described above for the match budget, but with reference to the offset goal value.

The budget process 960 for selection constraints differs from previously described processes in that the choice is not numeric. That is to say, rather than selecting a numeric goal, the budget for a selection constraint determines a numeric score for each possible choice and then selects the routing strategy with the most suitable score. For example, the score may indicate an amount of resource that does not meet the criteria for the selection.

In certain embodiments of the invention, the score is computed from a weighted sum:

$$s_j \equiv \sum_{i=1}^{n} w_i v_{ij},$$

where $s_j$ is the score for choice j, $v_{ij}$ is the current value of a resource used by group i that is not as prescribed by choice j and $w_i$ is a weight associated with group i. The routing engine 640 would route the direct connection in accordance with the lowest scored choice j.

Figure 12:
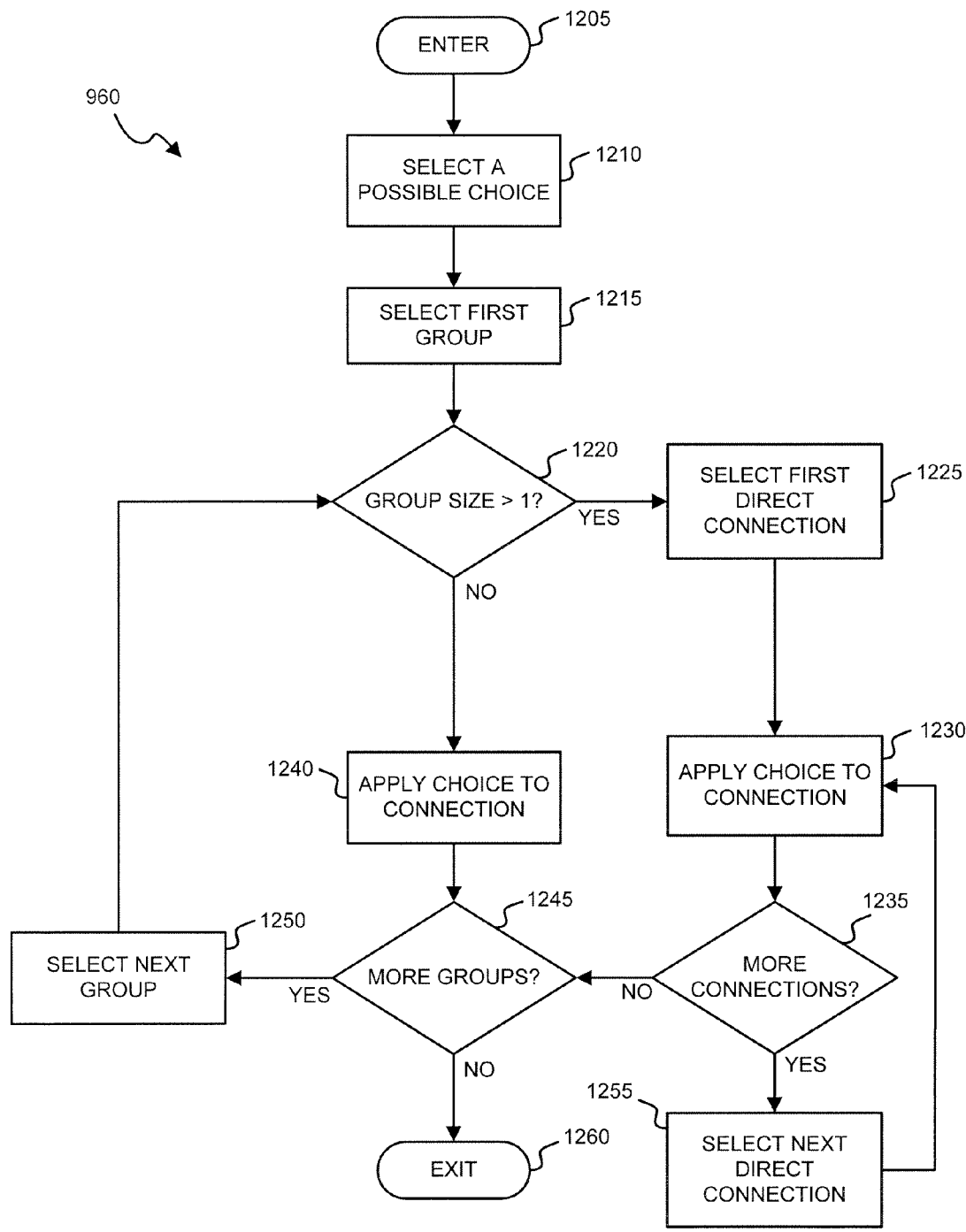
FIG. 12 is a flow diagram illustrating certain process steps of a selection constraint budgeting process consistent with the present invention.

An exemplary selection budgeting process 960 is illustrated in FIG. 12. The process 960 is entered at block 1205 and flow is there transferred to block 1210, where a possible choice j is selected in accordance with the computed sum given above. At block 1215, a first group is selected and the number of direct connections in the group is determined in block 1220. If the group has a single direct connection, the choice is applied to the budget for that connection at block 1240. If more than one direct connection exists in the group, a first connection is selected at block 1225. The process 960 then proceeds to block 1230, where the selection budget is applied to the connection. If more direct connections are to be budgeted, as determined at block 1235, the process flow is transferred to block 1255, where the next direct connection is selected. The process then returns to block 1230, where the next connection is budgeted. If it is determined at block 1235 that all of the connections are in the group have been budgeted, flow is transferred to block 1245, where it is determined if other groups must be budgeted. If not, the process 960 is exited at block 1260. If another group awaits budgeting, it is selected at block 1250 and the process returns to block 1220 and continues from that point.

To demonstrate by a numerical example, suppose the global selection constraint requires that routes for two different groups be confined to either layers 2 and 3, i.e., j=1, or layers 5 and 6, i.e., j=2. The value $v_{11}$ would be the amount of resource for group 1 existing on any layers other than layers 2 and 3, value $v_{21}$ would be the resource amount for group 2 existing any layers other than on layers 2 and 3, the value $v_{12}$ would be the amount of resource for group 1 existing on any layers other than layers 5 and 6, and value $v_{22}$ would be the resource amount for group 2 existing on any layers other than layers 5 and 6. If all the weights are equal, the selection scores would reflect the total amount of resources consumed by both groups on layers other than the layers of assigned by the corresponding choice. Thus, the set of layers having the fewest routes not in compliance with the corresponding selection would have the lowest score and would be selected.

The weights $w_i$ may be adjusted in the cost function modifying step 740 to alter the selection when one or more routes cannot be completed in accordance with the selection after a certain number of attempts. In certain embodiments of the invention, the weights are assigned a value that reflects the number of routing passes for which the selection constraint failed to be satisfied. By way of this weighting scheme, if the $i^{th}$ group cannot be routed under selection j after several attempts, its weights are, for example, incremented at each unsuccessful routing pass. The sum for other selections, one of which will be the smallest, will eventually dominate the other selection scores, and the selection having the lowest score, as determined, for example, the amount of resources not in compliance with the selection, will be chosen.

The descriptions above are intended to be illustrative and not restrictive. Numerous variations, modifications and alternatives will be apparent to the skilled artisan upon review of this disclosure. For example, components individually described as discrete may be combined, functionality described with reference to a single element may be distributed across several components, and processes may be combined or separated into sub-processes and execute independently of other sub-processes. The present invention is intended to encompass all such variations, modifications and alternatives. The scope of the invention should therefore be determined not from the descriptions above, but from the appended claims, along with their full range of equivalents.

What is claimed is:

1. A method for routing interconnections between terminals in a circuit layout comprising:

specifying, by a processor, a global routing constraint on placement of routing objects between the terminals such that an interconnect solution for the terminals is obtained only by said placement satisfying said global constraint;

iteratively executing, by a processor, a plurality of routing passes for respectively routing a plurality of interconnections between terminals in the circuit layout, each said routing pass including:

determining whether said global routing constraint remains unsatisfied and specifying responsive to said determination a local routing constraint on placement of said routing objects to form a direct route for a direct connection between a pair of the terminals; and, placing said routing objects to form said route satisfying said local routing constraint;

modifying, by a processor, said local routing constraint responsive to said determination for at least one said routing pass indicating that placed routing objects do not satisfy said global routing constraint.

2. The method for routing interconnections as recited in claim 1, where said local routing constraint specifying includes:

determining a type of constraint for said global routing constraint; and creating said local routing constraint to be of said type of constraint if said local routing constraint has not been previously so created.

3. The method for routing interconnections as recited in claim 2, where said local routing constraint creating includes executing a budgeting process responsive to said type of constraint being determined, said budgeting process being operationally specific to said type of constraint.

4. A method for routing interconnections between terminals in a circuit layout comprising:

specifying, by a processor, a global constraint on lacement of routing objects between the terminals such that an interconnect solution for the terminals is obtained only by said placement satisfying said global constraint;

iteratively executing, by a processor, a plurality of routing passes for respectively routing a plurality of interconnections between terminals in the circuit layout, each said routing pass including:

determining whether said global constraint remains unsatisfied and specifying responsive to said determination a local constraint on placement of said routing objects to form a direct route for a direct connection between a pair of the terminals; and, placing said routing objects to form said route satisfying said local constraint;

where said routing objects placing includes:

modifying said local constraint upon a determination that placed routing objects do not satisfy said global constraint;

replacing said routing objects to form said direct route satisfying said modified local constraint; and repeating said local constraint modifying and said routing objects replacing until said global constraint is satisfied.

5. The method for routing interconnections as recited in claim 4, where said local constraint modifying includes modifying a cost function by which said placement of said routing objects is determined, said cost function being modified so as to reduce a cost metric returned by said cost function when said routing objects are subsequently replaced.

6. A method for routing interconnections between terminals in a circuit layout comprising specifying, by a processor, a global constraint on placement of routing objects between the terminals such that an interconnect solution for the terminals is obtained only by said placement satisfying said global constraint;

determining, by a processor, whether said global constraint remains unsatisfied and specifying responsive to said determination a local constraint on placement of said routing objects to form a direct route for a direct connection between a pair of the terminals; and, placing, by a processor, said routing objects to form said route satisfying said local constraint;

where said local constraint specifying includes: determining a type of constraint for said global constraint; and, creating said local constraint to be of said type of constraint if said local constraint has not been previously so created;

said local constraint creating includes executing a budgeting process responsive to said type of constraint being determined, said budgeting process being operationally specific to said type of constraint; and, said budgeting process executing includes executing said operationally specific process for each of a min constraint, a max constraint, a min/max constraint, a match constraint, a relative constraint and a selection constraint respectively upon such type of constraint being determined as said type of constraint for said global constraint.

7. The method for routing interconnections as recited in claim 6, where said operationally specific budgeting process executing includes configuring a cost function for said min constraint, said max constraint, said min/max constraint, said match constraint and said relative constraint such that said placement of said routing objects satisfying said local constraint is at a minimum cost as determined by said cost function.

8. A method for routing interconnections between terminals in a circuit layout, the terminals being elements in a system of at least one design database, the method comprising:

specifying, by a processor, a global routing constraint on placement of routing objects for the system such that an interconnect solution for the system is obtained only by said placement satisfying said global constraint, said global routing constraint including a constraint on placement of said routing objects forming a direct route for each of a plurality of direct connections between a source terminal and a target terminal;

iteratively executing, by a processor, a plurality of routing passes for respectively routing a plurality of interconnections between terminals in the circuit layout, each said routing pass including:

determining in a manner consistent with said global routing constraint at least one local routing constraint for each said direct route, said local routing constraint constraining placement of said routing objects forming each said direct route; and, placing said routing objects to form each said direct route to satisfy said corresponding local tin constraint;

modifying, by a processor, said local routine constraint responsive to said determination for at least one said routing pass indicating that placed routing objects do not satisfy said global routing constraint.

9. The method for routing interconnections as recited in claim 8, where said routing objects placing includes:

modifying a cost function associated with each said local routing constraint, each said cost function providing a cost metric with respect to a corresponding said local routing constraint for a placement of said routing objects upon a determination that placed routing objects do not satisfy said global routing constraint, each said cost function modified so as to reduce said cost metric when said routing objects are subsequently replaced for said corresponding route;

replacing said routing objects to form each said route in accordance with said corresponding modified cost function; and repeating said cost function modifying and said routing objects replacing until said global routing constraint is satisfied.

10. The method for routing interconnections as recited in claim 9, where said cost function modifying includes modifying parameters of line segments in a piecewise linear cost function for each said local routing constraint.

11. The method for routing interconnections as recited in claim 8, where said local constraint determining includes:

determining an amount of a routing resource defined by said global constraint not consumed by said routing objects;

apportioning said amount of said routing resource to each said direct route through said corresponding local constraint; and defining parameters of each said cost function of said corresponding local constraint so that placement of said routing objects for each said direct route consumes said apportioned amount of said routing resources.

12. A method for routing interconnections between terminals in a circuit layout, the terminals being elements in a system of at least one design database, the method comprising:

specifying, by a processor, a global constraint on placement of routing objects for the system such that an interconnect solution for the system is obtained only by said placement satisfying said global constraint, said global constraint including a constraint on placement of said routing objects forming a direct route for each of a plurality of direct connections between a source terminal and a target terminal;

determining, by a processor, in a manner consistent with said global constraint at least one local constraint for each said direct route, said local constraint constraining placement of said routing objects forming each said direct route; and, placing, by a processor, said routing objects to form each said direct route to satisfy said corresponding local constraint;

where said local constraint determining includes:
determining a goal value of a resource for each said local constraint from a resource value of said global constraint; and,
defining parameters of a cost function for each said local constraint such that a placement of said routing objects meeting a minimum cost metric as computed by said corresponding cost function is in accordance with said corresponding goal value.

13. The method for routing interconnections as recited in claim 12, where said routing objects placing includes:
modifying each said goal value upon a determination that placed routing objects do not satisfy said global constraint;
modifying said cost function parameters of each said cost function in accordance with said corresponding modified goal value;
replacing said routing objects to form each said direct route having said minimum cost metric thereof being in accordance with said corresponding modified goal value; and
repeating said goal value modifying said cost function modifying and said routing objects replacing until said global constraint is satisfied.

14. The method for routing interconnections as recited in claim 13 where said goal resource modifying includes:
modifying weighting values of a weighted sum goal calculating function;
determining a value from said weighted sum goal calculating function; and
determining said modified goal value for each local constraint from said value.

15. An apparatus for routing interconnections between terminals in a circuit layout, the terminals being elements in a system of at least one design database, the apparatus comprising:

a memory having stored therein data representing the circuit layout including data representing a plurality of terminals, said memory having further stored therein data defining global tin constraints constraining placement of routing objects for interconnecting terminals of a connection between a source terminal and a target terminal; and a routing engine being operable to iteratively execute a plurality of routing passes for respectively routing a plurality of interconnections between terminals in the circuit layout, each said routing pass including: determining a direct connection path between pairs of said terminals from one said source terminal to one said target terminal, said direct connection path formed in accordance with respective local routing constraints on placement of said routing objects forming each direct connection, said local routing constraints derived from said global routine constraints during each said routing pass such that finding an interconnect solution for said plurality of terminals is achieved through finding said direct connection paths in accordance with said local routine constraints;

wherein said local routing constraint is modified responsive to said determination for at least one said routing pass indicating that laced routing objects do not satisfy said global routing constraint.

16. The apparatus for routing interconnections as recited in claim 15, wherein said routing engine computes a cost metric from a cost function associated with each said local routing constraint, said routing engine selecting each said direct connection path to minimize said cost metric, said cost function being modified for each said local routing constraint upon a determination that said global routing constraint has not been satisfied.

17. The apparatus for routing interconnections as recited in claim 15, wherein said source terminal and said target terminal are in distinct design databases of the system.

18. A computer readable storage device encoded with computer instructions which when executed by a computer system for routing interconnections between terminals in a circuit layout comprises:

specifying a global routing constraint on placement of routing objects between the terminals such that an interconnect solution for the terminals is obtained only by said placement satisfying said global constraint; and, iteratively executing a plurality of routing passes for respectively routing a plurality of interconnections between terminals in the circuit layout, each said routing pass including:

determining whether said global routing constraint remains unsatisfied and specifying responsive to said determination a local routing constraint on placement of said routing objects to form a direct route for a direct connection between a pair of the terminals; and, placing said routing objects to form said route satisfying said local routing constraint;

modifying said local routing constraint responsive to said determination for at least one said routing pass indicating that placed routing objects do not satisfy said global routing constraint.

* * * * *